(12) United States Patent
Iwamoto et al.

(10) Patent No.: US 6,919,778 B2
(45) Date of Patent: Jul. 19, 2005

(54) DUPLEXER WITH AN IMPEDANCE MATCHING CIRCUIT AND AN ELECTRONIC DEVICE USING THE SAME

(75) Inventors: Yasuhide Iwamoto, Kawasaki (JP); Osamu Ikata, Suzaka (JP)

(73) Assignee: Fujitsu Media Devices Limited, Kanagawa (JP)

(*) Notice: Subject to any disclaimer, the term of this patent is extended or adjusted under 35 U.S.C. 154(b) by 33 days.

(21) Appl. No.: 10/295,910

(22) Filed: Nov. 18, 2002

(65) Prior Publication Data

US 2003/0098757 A1 May 29, 2003

(30) Foreign Application Priority Data

Nov. 26, 2001 (JP) ........................................ 2001-359567

(51) Int. Cl.[7] .............................. H03H 9/72; H03H 9/64
(52) U.S. Cl. ...................................... 333/133; 333/193
(58) Field of Search .......................... 333/133, 193–196

(56) References Cited

U.S. PATENT DOCUMENTS 5,554,960 A * 9/1996 Ohnuki et al. ............... 333/132
5,561,406 A * 10/1996 Ikata et al. ................... 333/126
5,786,738 A * 7/1998 Ikata et al. ................... 333/133
5,859,473 A * 1/1999 Ikata et al. ................... 257/723
5,966,060 A * 10/1999 Ikada ........................... 333/193
6,351,194 B2 * 2/2002 Takahashi et al. ............ 333/133
6,366,179 B1 * 4/2002 Kuroda ......................... 333/133
6,501,344 B2 * 12/2002 Ikata et al. ................... 333/133

FOREIGN PATENT DOCUMENTS

| JP | 3-206653 | * | 9/1991 |
| JP | 4-35202 | | 2/1992 |
| JP | 6-97315 | | 4/1994 |
| JP | 6-97761 | | 4/1994 |
| JP | 6-310979 | | 11/1994 |
| JP | 9-51206 | | 2/1997 |
| JP | 10-126213 | | 5/1998 |

* cited by examiner

Primary Examiner—Barbara Summons
(74) Attorney, Agent, or Firm—Arent Fox PLLC

(57) ABSTRACT

A duplexer includes a multilayer package, SAW filters that have different band center frequencies and are provided in the multilayer package, and a phase matching line that matches phases of the SAW filters and are provided in the multilayer package. A ground pattern with respect to the phase matching line is provided on a mount surface of the multilayer package.

24 Claims, 13 Drawing Sheets

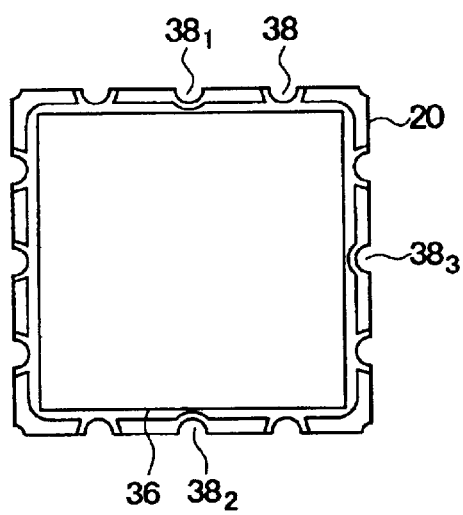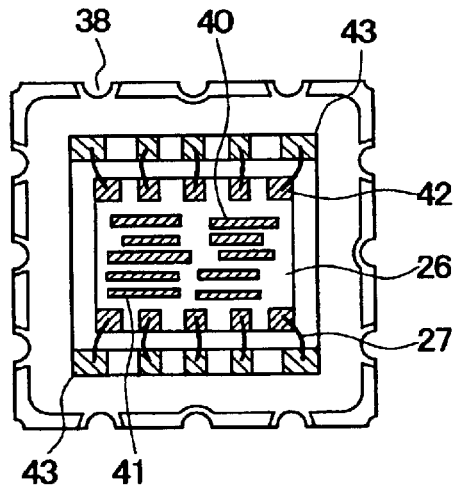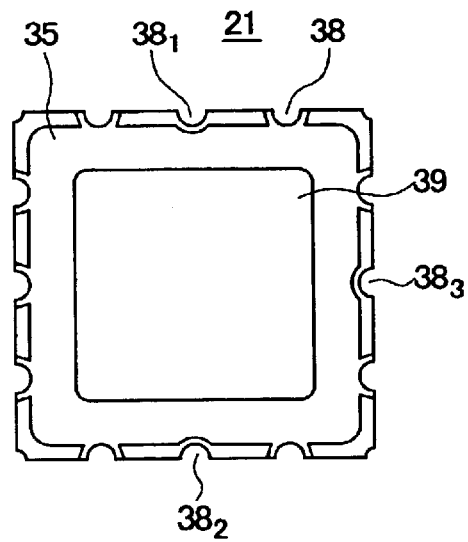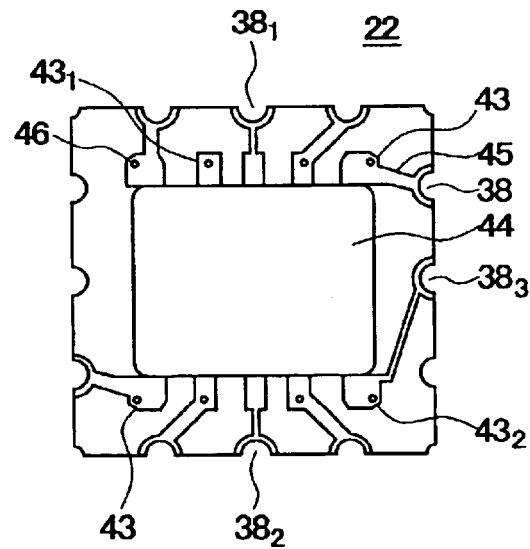

DUPLEXER WITH AN IMPEDANCE MATCHING CIRCUIT AND AN ELECTRONIC DEVICE USING THE SAME

BACKGROUND OF THE INVENTION

1. Field of the Invention

The present invention generally relates to duplexers using a band-pass type of surface acoustic wave filter (SAW filter), and more particularly, to a duplexer with an impedance matching circuit.

2. Description of the Related Art

In recent years, cellular phones and portable information terminals have spread with the development of mobile communication systems, and manufacturers compete with one another for downsizing and higher performance of these terminals. Some cellular phones operate in both the analog and digital systems and use both a band of 800 MHz to 1 GHz and another band of 1.5 GHz to 2.0 GHz.

Now, there is considerable activity in the development of dual-mode or dual-band cellular phones for improvement in performance. The dual-mode cellular phone operates in the analog and digital systems, or digital TDMA (Time Division Multiplexing Access) and CDMA (Code Division Multiplexing Access). The dual-band cellular phone operates in, for example, the 800 MHz and 1.9 GHz bands, or 900 MHz and 1.8 or 1.5 GHz bands. These cellular phones require higher-function components, which are simultaneously required to be downsized and cost-reduced.

In cellular phones as described above, a duplexer is used to branch off a signal in two ways. Generally, the duplexer is equipped with a filter and a phase (impedance) matching circuit. Many filters have a band-pass filter, a band-rejection filter or the combination thereof, any of which uses a dielectric substance. However, the recent years have seen a remarkable progress in development of SAW filters, which enable downsizing and higher performance.

FIGS. 1A and 1B show a conventional duplexer. More particularly, FIG. 1A shows a block diagram of the structure of the duplexer, and FIG. 1B is a graph of the frequency characteristic thereof. In FIG. 1B, the horizontal axis denotes frequency which becomes higher rightwards, and the vertical axis denotes the pass intensity which becomes stronger upwards. As shown in FIG. 1A, a duplexer 10 is made up of two filters 12 and 13, an impedance matching circuit (hereinafter simply referred to as matching circuit) 11, a common terminal 14 and individual terminals 15 and 16. The filters 12 and 13 are formed by SAW filters, and have different center frequencies f1 and f2 of the respective pass bands, wherein f2 is higher than f1 (f2>f1).

The matching circuit 11 is used to prevent the filter characteristics of the filters 12 and 13 from being degraded. It is now assumed that Z1 is defined as the characteristic impedance defined by viewing the filter 12 from the common terminal 14, and Z2 is defined as the characteristic impedance defined by viewing the filter 13 therefrom. Due to the function of the matching circuit 11, the characteristic impedance Z1 of the filter 12 matches with the characteristic impedance at the common terminal 14, while the characteristic impedance of the filter 13 is indefinite and the reflection factor is equal to 1 when the signal applied to the common terminal 14 has the frequency f1. In contrast, for the signal of the frequency f2 applied to the common terminal 14, the characteristic impedance on the filter 12 is indefinite and the reflection factor is equal to 1, while the characteristic impedance of the filter 13 matches with that of the common terminal 14.

The duplexer shown in FIG. 1A is disclosed in, for example, Japanese Unexamined Patent Publication Nos. 6-310979 and 10-126213. The publications show a downsized structure with a multilayer ceramics package and an impedance matching circuit formed by a strip line or microstrip line. Further, the publications show a structure of the matching circuit line that is formed on an intermediate layer embedded in the multilayer structure and is interposed between the upper and lower ground patterns. More particularly, the upper and lower ground patterns are formed on the layers adjacent to the layer on which the matching circuit pattern is formed so that the line is interposed therebetween.

However, the above-mentioned structure has a disadvantage resulting from the structure in which the upper and lower ground patterns are close to the impedance matching circuit line. The close location causes reduction in the characteristic impedance of the matching circuit line and degrades the filter characteristic. Using thicker layers of the multilayer package in order to increase the distance separation between the matching circuit line and the ground patterns may eliminate this problem. However, the above solution makes thicker the multilayer package and makes difficult downsizing.

SUMMARY OF THE INVENTION

It is an object of the present invention to provide a compact duplexer having improved filter characteristics and an electronic device with such a duplexer.

The above object of the present invention is achieved by a duplexer that includes: a multilayer package; SAW (Surface Acoustic Wave) filters that have different band center frequencies and are provided in the multilayer package; and a phase matching line that matches phases of the SAW filters and are provided in the multilayer package. A first ground pattern with respect to the phase matching line is provided on a mount surface of the multilayer package. The ground with respect to the phase matching line is formed on the mount surface of the multilayer package, so that the distance between the phase matching line and the ground can be adjusted properly. It is therefore possible to prevent decrease in the characteristic impedance of the matching line and improve the filter characteristic.

The ground with respect to the matching line may also be formed by a plurality of ground patterns with respect to the phase matching line that are provided at a first side of the multilayer package opposite to a second side thereof at which the SAW filters are provided.

The ground with respect to the matching line may also be formed so as to include: a first ground pattern that underlies the SAW filters; a second ground pattern that has an opening formed so as to face the first ground pattern and is provided in the multilayer package; a third ground pattern that is provided on a mount surface of the multilayer package and faces the opening of the second ground pattern; and a cap provided on the multilayer package. The ground with respect to the phase matching line is provided by a combination of the first and third ground patterns and another combination of the second ground pattern and the cap.

The ground with respect to the matching line may also be formed so as to include: a first ground pattern that underlies the SAW filters; a second ground pattern that has an opening formed so as to face the first ground pattern and is provided in the multilayer package; and a cap provided on the multilayer package. The ground with respect to the phase matching line is provided by a combination of the second ground pattern and the cap and another combination of the first ground pattern and a conductive pattern on a board on which the duplexer is mounted.

The ground with respect to the matching line may also be formed by a ground pattern provided on a mount surface of the multilayer package and a cap provided on the multilayer package.

The ground with respect to the matching line may also be formed by a ground layer with respect to the phase matching line that is provided so that at least two of layers forming the multilayer package are interposed between the phase matching line and the ground layer.

The ground with respect to the matching line may also be formed by ground with respect to the phase matching line that is provided by a ground pattern provided on a mount surface of the multilayer package and a cap provided on the multilayer package.

The ground with respect to the matching line may also be formed by a ground layer with respect to the phase matching line that is provided so that at least two of layers forming the multilayer package are interposed between the phase matching line and the ground layer.

The present invention includes an electronic device that includes the duplexer as described above.

BRIEF DESCRIPTION OF THE DRAWINGS

Other objects, features and advantages of the present invention will become more apparent from the following detailed description when read in conjunction with the accompanying drawings, in which:

FIG. 3A is a plan view of the duplexer shown in FIG. 2A;

FIG. 3B is a plan view of the duplexer shown in FIG. 2A from which a cap has been removed;

FIG. 3C is a plan view of a cap mount layer of the duplexer in FIG. 2A;

FIG. 3D is a plan view of a wire bonding pad layer of the duplexer in FIG. 2A;

DESCRIPTION OF THE PREFERRED EMBODIMENTS

Figure 1A:
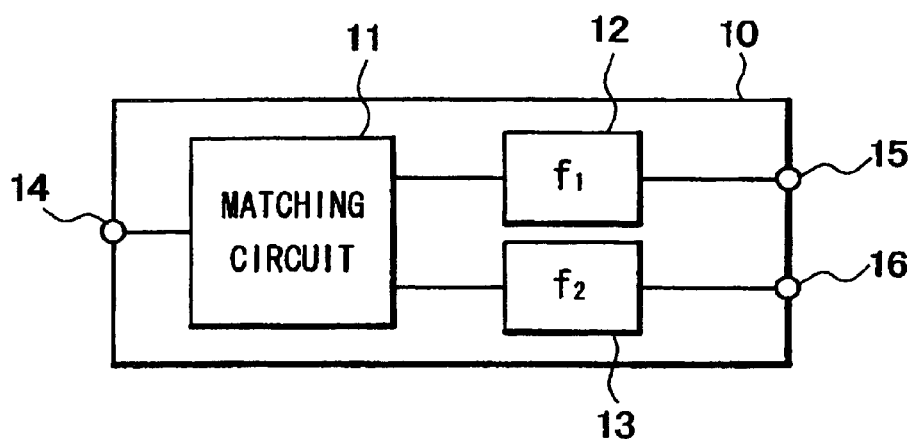
FIG. 1A is a block diagram of a conventional duplexer.
Figure 1B:
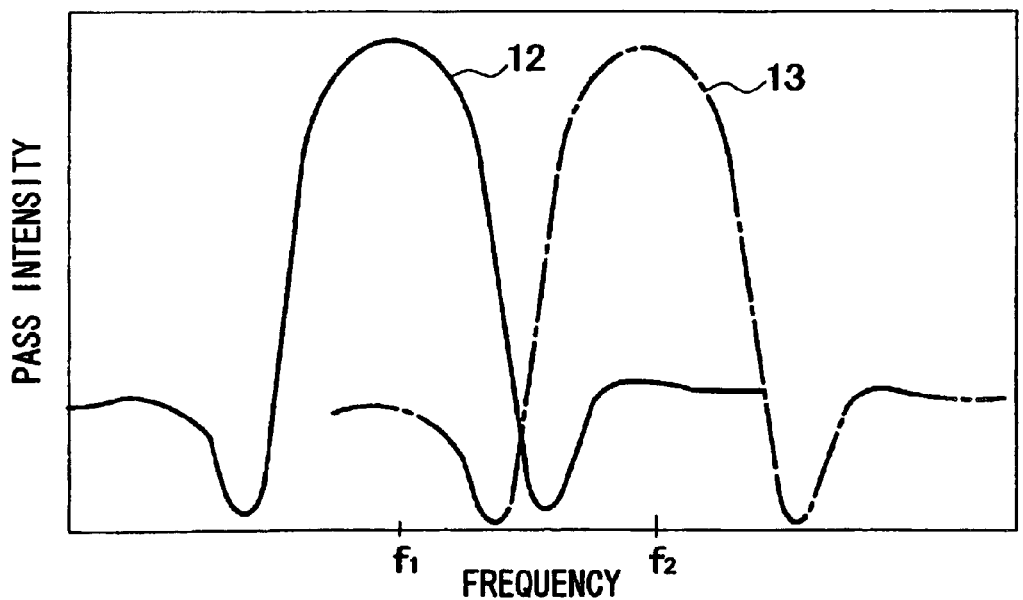
FIG. 1B is a graph of the frequency characteristic of the conventional duplexer shown in FIG. 1A.
Figure 2A:
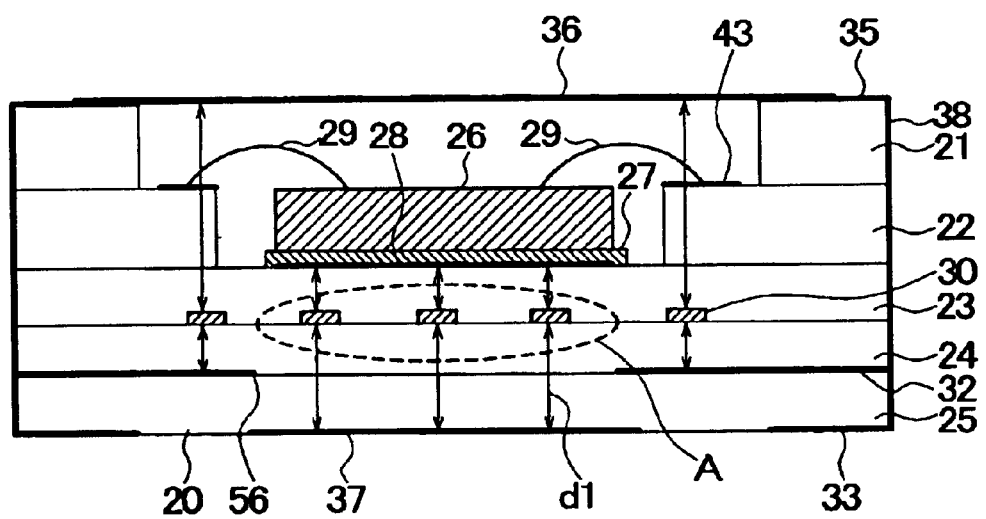
FIG. 2A is a cross-sectional view of a duplexer according to a first embodiment of the present invention.
Figure 2B:
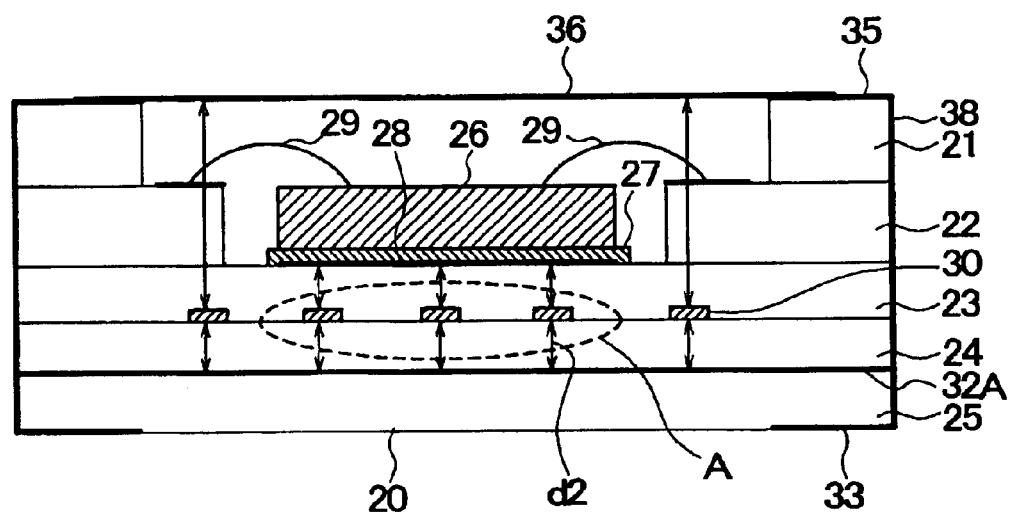
FIG. 2B is a cross-sectional view of a duplexer (comparative example)

Now, a description will be given of embodiments of the present invention with reference to the accompanying drawings.
First Embodiment FIG. 2A is a cross-sectional view of a duplexer according to a first embodiment of the present invention, and FIG. 2B is a cross-sectional view of a duplexer (comparative example) obtained by modifying the duplexer shown in FIG. 2A.
(Structure of the First Embodiment)

The duplexer shown in FIG. 2A includes a multilayer package 20, a filter chip 26, a phase (impedance) matching line 30, and a cap 36. The multilayer package 20 has five layers 21–25, which are laminated. The layer 21 is a cap mount layer. The layer 22 is a wire bonding pad layer. The layer 23 is a die attachment layer. The layer 24 is a phase matching line pattern layer. The layer 25 is a common ground layer. The layers 21–25 may, for example, be made of alumina having a dielectric constant of about 9.5 or glass ceramics.

The cap mount layer 21 and the wire bonding pad layer 22 define steps in the package. The space defined by the steps form a cavity for accommodating the filter chip 26. The filter chip 26 is accommodated in the cavity. The filter chip 26 is fixed to a die attachment part 28 formed on the die attachment layer 23 by using electrically conductive paste 27. The die attachment part 28 defines a chip mount surface, and is formed of an electrically conductive substance such as aluminum (Al). The multilayer package 20 has dimensions of, for example, 5×5×1.5 mm or 3.8×3.8×1.5 mm (1.5 mm is the thickness (height) of the package).

The cap 36 is mounted on the cap mount layer 21. FIG. 3A is a plan view of the duplexer shown in FIG. 2A. The cap 36 may be made of a metal using Au or Ni plating. Grooves 38 having a semispherical cross section are formed on sidewalls of the multilayer package 20. In FIG. 3A, three grooves 38 are formed per side. The grooves 38 continue to the common ground layer 25 from the cap mount layer 21. An electrically conductive layer may be formed in the grooves 38 so that conductive paths (side castellation paths) are formed.

FIG. 3B is a plan view of the duplexer observed by removing the cap 36 from the duplexer shown in FIG. 3A. In the plan view, the filter chip 26, the cap mount layer 21 and part of the wire bonding pad layer 22 appear. FIG. 3C is a plan view of the cap mount layer 21, and FIG. 3D is a plan view of the wire bonding pad layer 22.

As shown in FIG. 3C, a seal ring 35, which may be formed of an electrically conductive substance such as Al, is formed on the top of the cap mount layer 21. The cap 36 is placed on the seal ring 35. The cap mount layer 21 has an opening 39 located in the center thereof. The opening defines the cavity for accommodation of the filter chip 26. The seal ring 35 is connected to the conductive paths 38 except three conductive paths $38_1$, $38_2$ and $38_3$, which will be described later.

Figure 6:
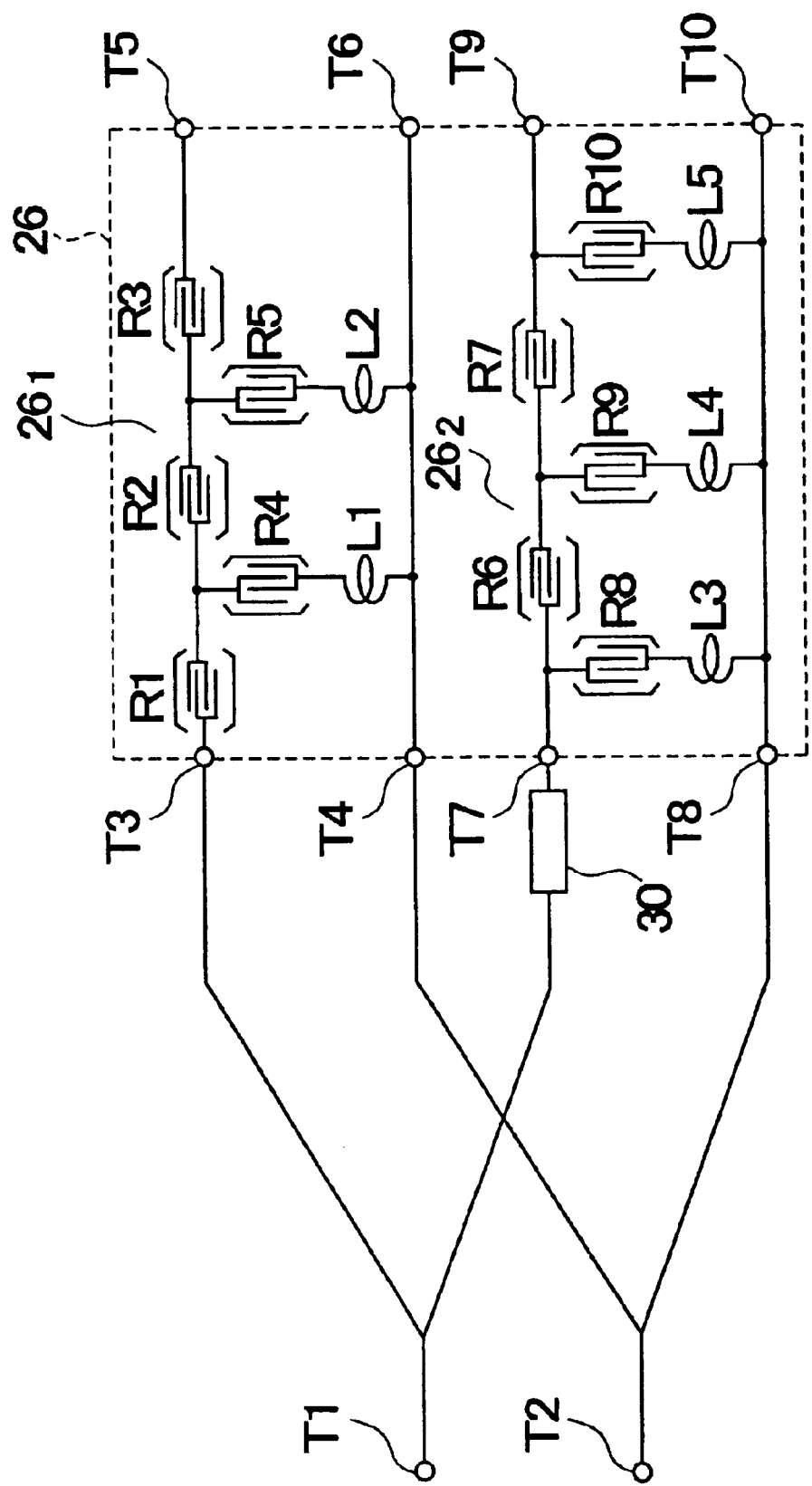
FIG. 6 is a diagram of filters that may be used in the duplexer.

The filter chip 26 has a circuit configuration in which one-port SAW resonators are connected in ladder formation. FIG. 6 is a circuit configuration of the duplexer according to the embodiment of the present invention. The filter chip 26 has two SAW filters $26_1$ and $26_2$. For example, the filter $26_1$ is used as a transmit filter having a pass band of the center frequency f1, while the filter $26_2$ is used as a receive filter having a pass band of the center frequency f2 (f2>f1). Each of the filters $26_1$ and $26_2$ has five one-port SAW resonators connected in ladder formation. Each of the SAW resonators has an interdigital transducer using a comb-tooth electrode, and reflectors arranged on opposing sides of the interdigital transducer.

As shown in FIG. 6, the SAW filter $26_1$ has five one-port SAW resonators R1–R5, and the SAW filter $26_2$ has five one-port SAW resonators R6–R10. The resonators R1–R3 of the filter $26_1$ are arranged in serial arms, while the resonators R4 and R5 are arranged in parallel arms. The parallel arms have inductance components L1 and L2, which are connected in series to the resonators R4 and R5, respectively. The inductance components L1 and L2 function to improve the filter characteristic, and may be formed by, for example, bonding wires. Bonding wires 29 that will be described later define these inductance components. Terminals T3 and T5 of the filter $26_1$ are signal terminals and are connected to the serial arms. Terminals T4 and T6 are ground terminals.

Resonators R6 and R7 of the filter $26_2$ are arranged in serial arms, and resonators R8–R10 are arranged in parallel arms. The parallel arms have inductance components L3–L5 connected to the resonators R8–R10, respectively. The inductance components L3–L5 function to improve the filter characteristic, and may be formed by, for example, bonding wires. The bonding wires 29, which will be described in detail later, define these inductance components. Terminals T7 and T9 of the filter $26_2$ dare signal terminals, and are connected to the parallel arms. Terminals T8 and T10 are ground terminals.

Terminals T1 and T2 are common terminals of the duplexer. The terminal T1 is a signal input/output terminal, and the terminal T2 is a ground terminal. The terminal T1 is connected to the terminal T3 and one end of the phase matching line 30. The terminal T2 is connected to the terminals T4 and T8.

Turning to FIG. 3B again, the filter chip 26 has a single-piece substrate on which electrodes are formed. Five blocks indicated by a reference numeral 51 correspond to the resonators R1–R5 (or may be defined as the electrodes and reflectors thereof) of the SAW filter $26_1$. Similarly, five blocks correspond to resonators R6–R10 (or may be defined as the electrodes and reflectors thereof) of the SAW filter $26_2$. The resonators R1–R10 are connected via interconnection patterns formed on the substrate, as shown in FIG. 6, and are further connected to wire bonding pads 42 formed on the substrate. The substrate may, for example, be a piezoelectric single crystal such as $LiTaO_3$ (for instance, Y-cut 42-degree X-propagation). The electrodes formed on the substrate may be formed of an alloy that may contain Al as the major component. Examples of such an alloy are Al—Cu and Al—Mg. Also, a multilayer electrode structure may be employed. The multilayer electrode may be formed by forming Al—Cu/Cu/Al—Cu, Al/Cu/Al, Al/Mg/Al, Al—Mg/Mg/Al—Mg by sputtering and patterning the laminated electrode layers by developing and etching.

The wire bonding pads 42 are connected to wire bonding pads 43 formed on the wire bonding pad layer 22 by means of bonding wires 29, which may be made of Al—Si.

As shown in FIG. 3D, the wire bonding pad layer 22 has an opening 44 located in the center thereof. The opening 44 is smaller than the opening 39 of the cap mount layer 21. Five wire bonding pads 43 are aligned along each of two opposing sides of the opening 44. The wire bonding pads 43 except one that is assigned a reference numeral $43_1$, are electrically connected to the corresponding conductive paths 38 via lead lines 45. A circle indicated by a reference number 46 is a via, which is connected to the corresponding wire bonding pad 43. The wire bonding pad $43_1$ is connected to one end of the phase matching line 30 via the corresponding via 46. The wire bonding pad $43_2$ is connected to the other end of the phase matching line 30 via the corresponding via 46. Among the conductive paths 38, the conductive path $38_1$ corresponds to the terminal T5 shown in FIG. 6, and the conductive path $38_2$ corresponds to the terminal T9. Further, the conductive path $38_3$ corresponds to the terminal T1.

Figure 4A:
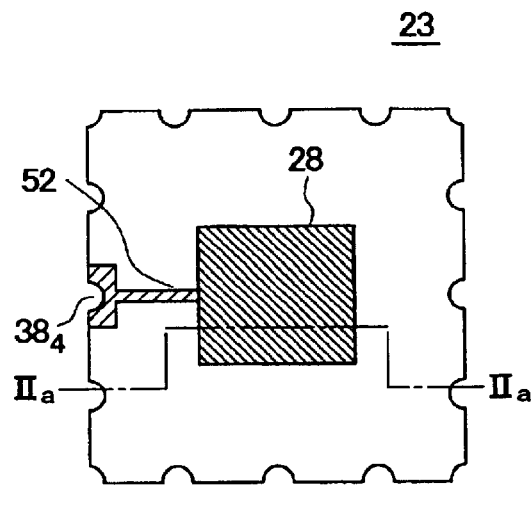
FIG. 4A is a plan view of a die attachment layer of the duplexer in FIG. 2A.

The die attachment layer 23 is formed as shown in FIG. 4A. The die attachment part 28 of a rectangular shape is formed on the die attachment layer 23. As shown in FIG. 2A, the filter chip 26 is attached to the die attachment part 28 by the electrically conductive paste 27. The die attachment part 28 is connected, via a lead pattern 52, to the conductive path 384, which functions as ground. The cross section of FIG. 2A corresponds to that taken along one-dotted chain line IIa—IIa shown in FIG. 4A.

Figure 4B:
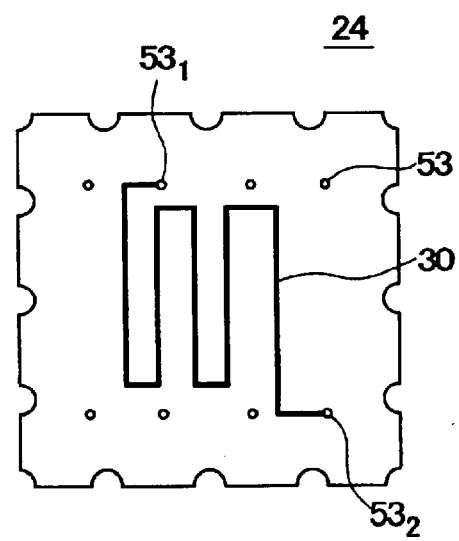
FIG. 4B is a plan view of a phase matching line pattern layer of the duplexer in FIG. 2A.

The die attachment layer 23 is laminated on the phase matching line pattern layer 24 shown in FIG. 4B. As shown in this figure, the phase matching line 30 is formed on the pattern layer 24. The matching line 30 has a pattern that is bent in order to secure a desired length. The length and width of the matching line 30 are determined so that the line 30 has a given characteristic impedance value (for example, 50 Ω). The matching line 30 may be made of an electrically conductive substance that contains copper (Cu), silver (Ag) or tungsten (W) as the major component. The matching line 30 may be formed by forming a conductive film on the matching line layer 24 and patterning it by laser trimming. A plurality of vias 53 are formed in the matching pattern layer 24. In the arrangement shown in FIG. 4B, the vias 53 are arranged in two lines. The vias 53 are provided for making electrical connections with circuit patterns formed on at least one of the opposing surfaces of the layer 24. More particularly, the vias 53 communicate with the corresponding vias 46 in the wire bonding pad layer 22 shown in FIG. 3D. The via $53_1$ among the vias 53 communicates with the corresponding via $43_1$, and the via $53_2$ communicates with the via $43_2$.

Figures 4C, 4D:
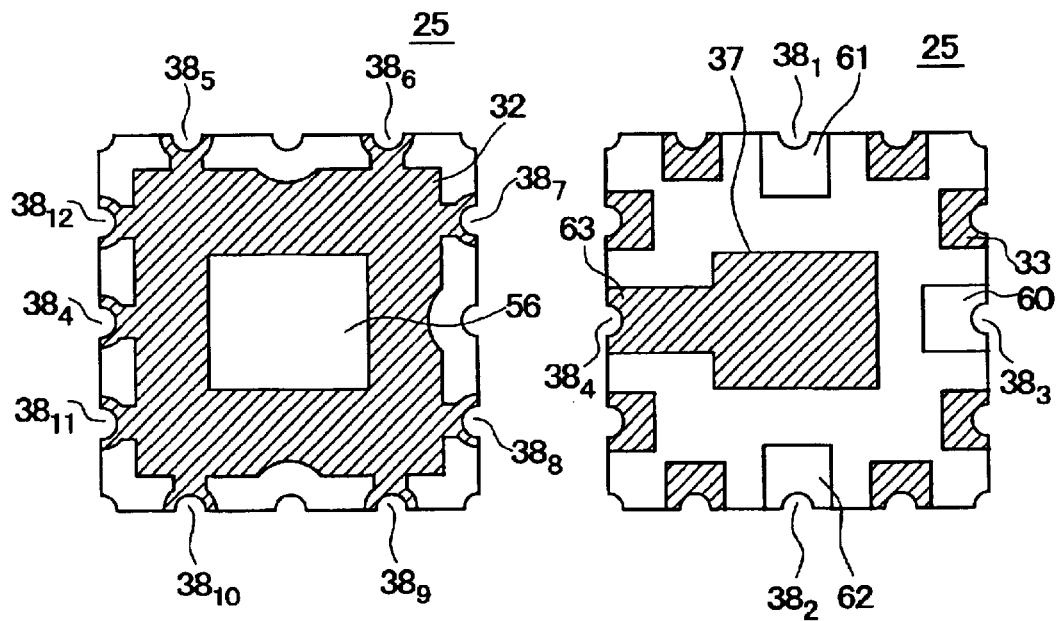
FIG. 4C is a plan view of a common ground layer of the duplexer in FIG. 2A.
FIG. 4D is a bottom view of the common ground layer.

The common ground layer 25 underlies the phase matching line pattern layer 24. FIG. 4C shows the upper surface of the common ground layer 25, and FIG. 4D shows the lower (bottom) surface thereof by seeing through the layer 25 from the upper surface. An inner ground pattern 32 is formed on the upper surface of the common ground layer 25. The inner ground pattern 32 is formed so as to define an opening 56 in the center thereof. The opening 56 has a size that enables part of the matching line 30 that underlies the die attachment part 28 shown in FIG. 2A to be viewed through the opening 56 from the bottom side. In FIG. 2, three sectional parts (surrounded by an ellipse "A") among the five sectional parts of the matching line pattern 30 except the two parts located on the rightmost and leftmost sides can be seen via the opening 56 from the bottom side of the package 20. Of course, the inner matching line 30 cannot be seen in the completed package 20 due to the presence of the common ground layer 25. The opening 56 may have substantially the same size as the die attachment part 28. The rectangular ring portion of the inner ground pattern 32 faces the end portions of the matching line 30. In other words, the inner ground pattern 32 covers part of the matching line 30. The sectional portions of the matching line 30 located at the ends thereof are interposed between the common ground layer 25 and the cap mount layer 21. This arrangement will be described later.

The ground pattern in the present specification may include an electrically conductive layer or film that can be used as ground irrespective of the shape, size and production method thereof.

The bottom surface of the common ground layer 25 is the mount surface of the duplexer. The duplexer may be mounted on a circuit board so that the mount surface faces the circuit board. As shown in FIG. 4D, terminals 33, 60, 61 and 62 for making external connections and an outer ground pattern 37 are formed on the mount surface of the duplexer. These electrodes may be called castellation electrodes or footpads. Then the duplexer is mounted onto the circuit board, and the electrodes of the duplexer for external connections contact electrodes formed on the circuit board, so that electrical connections can be made.

The external connection terminals 33 are used as ground terminals. In FIG. 4D, eight terminals 33 are provided. The terminal 33 connected to the conductive path $38_4$ is integrally formed with a lead line 63, which extends from the outer ground pattern 37. The conductive path $38_4$ electrically connects the outer ground pattern 37, the inner ground pattern 32, the die attachment part 28, the seal ring 35 and the cap 36. The other electrodes 33 are electrically connected to the seal ring 35 and the cap 36 via the corresponding conductive paths 38. The ground terminals T2, T4, T6, T8 and T10 are implemented by the above ground arrangement.

An external connection terminal 60 serves as an antenna terminal (ground terminal), and corresponds to the terminal T1 shown in FIG. 6. The external connection terminal 60 is connected to the wire bonding pad $43_2$ shown in FIG. 3D via the corresponding conductive path $38_3$. An external connection terminal 61 serves as a transmit terminal, and corresponds to the terminal T5 shown in FIG. 6. The external connection terminal 61 is connected to the resonator R3 of the SAW filter $26_1$ via the corresponding conductive path $38_1$ and bonding pad 43. An external connection terminal 62 is connected to the resonators R7 and R10 of the SAW filter $26_2$ shown in FIG. 6 via the corresponding conductive path $38_2$ and bonding pad 43.

The external ground pattern 37 has a size that covers part of the phase matching line 30 that underlies the die attachment part 28 shown in FIG. 2A. The external ground pattern 37 provides the ground layer with respect to the part of the phase matching line 30. The pattern 37 may have substantially the same shape as the die attachment part 28. The pattern 37 may have substantially the same size as the opening 56. The pattern 37 may face part of the phase matching line 30, more specifically, the center part thereof via the opening 56.

(Characteristic Impedance of Phase Matching Line 30)

Now, a description will be given of the characteristic impedance of the phase matching line 30.

A capacitance component with respect to the phase matching line 30 is one of the factors that define the characteristic impedance of the matching line 30. In FIG. 2A, the die attachment part 28, the cap 36, the inner ground pattern 32 and the outer ground pattern 37 define the capacitance component with respect to the phase matching line 30.

More particularly, the duplexer shown in FIG. 2A includes the die attachment part 28 (first ground pattern) that underlies the two SAW filters $26_1$ and $26_2$, the inner ground pattern 32 (second ground pattern) that has the opening 56 through which the first ground pattern 28 can be seen and is provided in the multilayer package 20, the outer ground pattern 37 (third ground pattern) provided on the mount surface of the package 20 and positioned so as to cover the opening 56, and the cap 36 provided on the package 20. The ground layers or planes with respect to the phase matching line 30 are formed by the combination of the first and third ground pattern and the combination of the second ground pattern and the cap 36. In other words, the phase matching pattern 30 has a strip line to which a plurality of combinations of different ground patterns are provided. The phase matching line 30 is provided with a plurality of ground patterns located at the first side of the line 30 opposite to the second side at which the SAW filters $26_1$ and $26_2$ are located. In the first embodiment of the present invention, the inner ground pattern 32 and the outer ground pattern 37 form the ground planes located at the first side of the matching line 30.

The capacitance components are defined between the matching line 30 and the above-mentioned ground patterns. Arrows shown in FIGS. 2A and 2B indicate capacitance components and the distances between the elements that define these capacitance components. As described before, the capacitance increases as the distance between the phase matching line and the conductive layer close thereto decreases. Then, the increased capacitance decreases the characteristic impedance of the matching line. The first embodiment of the present invention has the unique structure that prevents the characteristic from decreasing and allows it to be set at the desired characteristic impedance (for example, 50 Ω).

More particularly, the outer ground pattern 37 is provided on the mount surface of the duplexer, namely, the lower (bottom) surface of the common ground layer 25. The outer ground pattern 37 is located at a distance equal to the phase matching pattern layer 24 and the common ground layer 25 from the matching line 30. The outer ground pattern 37 is located at the first side of the matching line 30 opposite to the second side thereof at which the SAW filters $26_1$ and $26_2$ are provided, that is, the filter chip 26 is provided, and is located at a distance equal to at least two of the layers of the multilayer package 20 from the matching line 30. It is thus possible to separate the outer ground pattern 37 from the matching line 30 at a distance d1 (FIG. 2A) enough to prevent the characteristic impedance from deceasing and obtain a desired characteristic impedance value. The outer ground pattern 37 that covers the matching line 30 functions to shield the line 30 from external interference. It is therefore possible to prevent the matching line 30 from being externally interfered and the filter characteristic of the duplexer from varying.

Figure 5A:
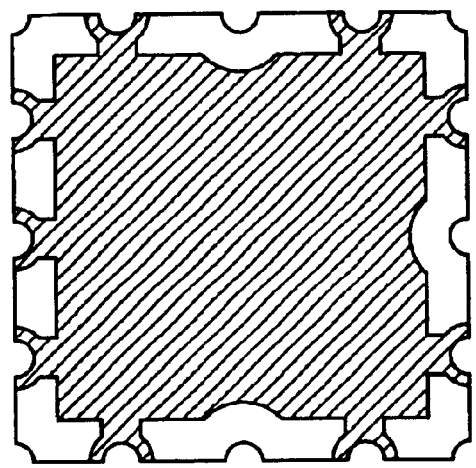
FIG. 5A is a plan view of a common ground layer of the comparative example shown in FIG. 2B.
Figure 5B:
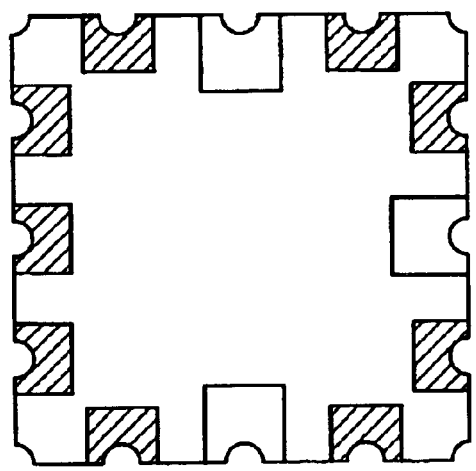
FIG. 5B is a bottom view of the common ground layer of the duplexer in FIG. 2B.

As compared to the comparative example shown in FIG. 2B, an inner ground pattern 32A covers the whole upper surface of the common ground layer 25. The upper surface of the common ground layer 25 shown in FIG. 2B is shown in FIG. 5A, and the lower surface thereof is shown in FIG. 5B. Any layer like the outer ground pattern 37 shown in FIG. 4D is not provided on the lower surface of the common ground layer 25 of the comparative example. The ground layer with respect to the entire matching line including part A shown in FIG. 2B is formed by the inner ground pattern 32A. Distance d2 shown in FIG. 2B is shorter than the distance d1 in FIG. 2A. A comparatively large capacitance component is coupled with the phase matching line 30 in the comparative example, this resulting in decrease of the characteristic impedance value.

Figure 7:
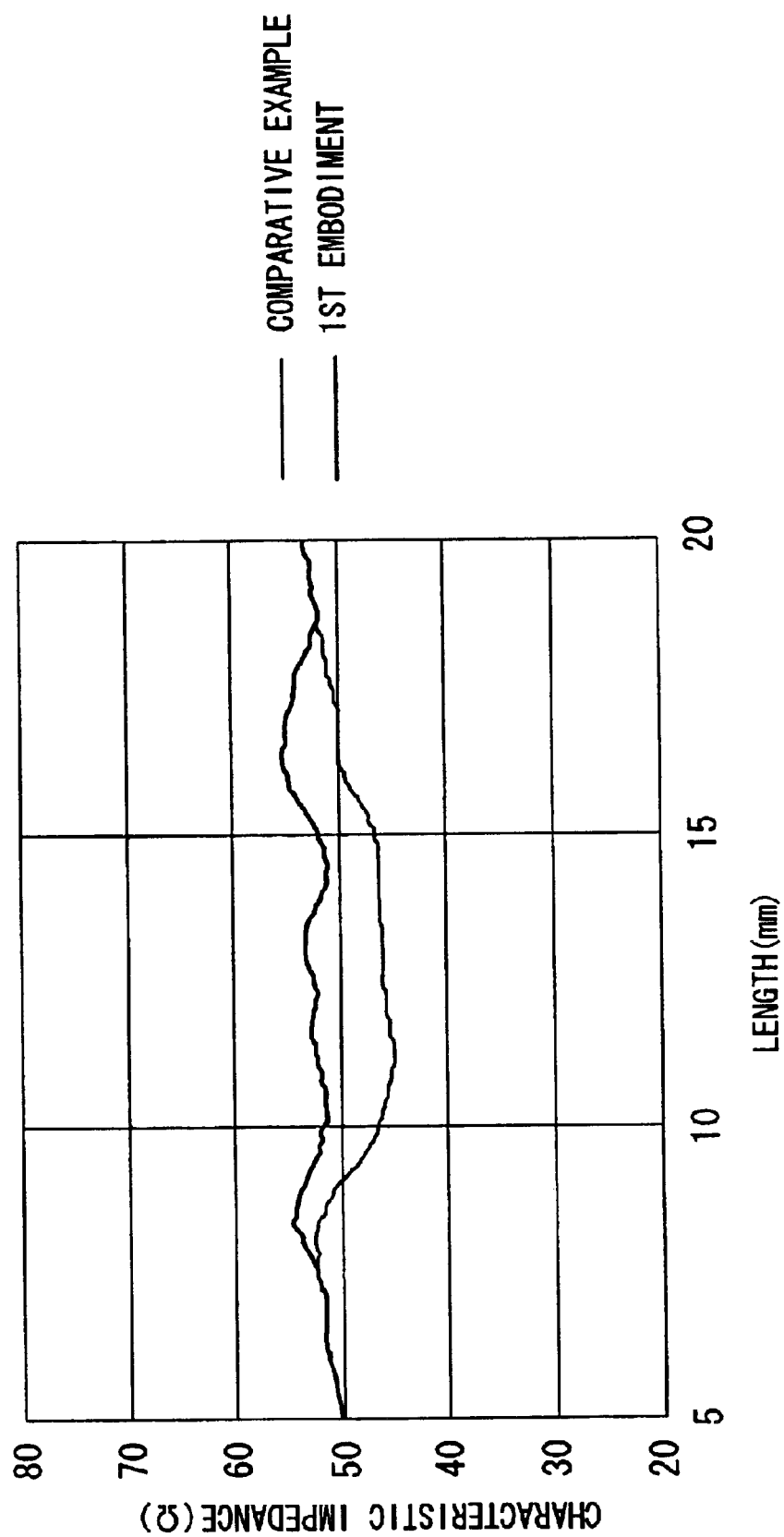
FIG. 7 is a graph of the characteristic impedance of the first embodiment of the invention and the comparative example.

FIG. 7 shows relationships between the length of the matching line 30 and the characteristic impedance in FIGS. 2A and 2B. The horizontal axis of the graph denotes the length (mm) of the matching line 30, and the vertical axis thereof denotes the characteristic impedance value Q. The thick line shows the characteristic of the duplexer shown in FIG. 2A, and the thin line shows that of the duplexer shown in FIG. 2B. In the structure shown in FIG. 2A, the matching line 30 and the outer ground pattern 37 are spaced apart from each other at an enough distance d1. This enables the characteristic impedance of the matching line 30 to be close to 50 Ω, more specifically, to be slightly higher than 50 Ω. In contrast, the characteristic impedance value of the comparative duplexer is lower than 50 Ω in the range of 8 mm to 17 mm. It can be seen from FIG. 7 that the structure shown in FIG. 2A prevents the characteristic impedance of the matching line 30 from decreasing and realizes excellent impedance matching.

The arrangement of the ground layers with respect to the phase matching line 30 in the first embodiment of the present invention makes it possible to easily adjust the characteristic impedance value of the matching line 30. For example, the characteristic impedance of the matching line 30 can be controlled by the ratio of the area interposed between the die attachment part 28 and the outer ground pattern 37 to the area interposed between the cap 36 and the inner ground pattern 32. The characteristic impedance may also be controlled by changing the distance d1 shown in FIG. 2A. Further, the characteristic impedance can be controlled by changing the distance between the matching line 30 and any of the die attachment part 28, inner ground pattern 32 and the cap 36. Thus, it is possible to easily optimize the design of the multilayer package 20.

(Filter Characteristic)

Figure 8:
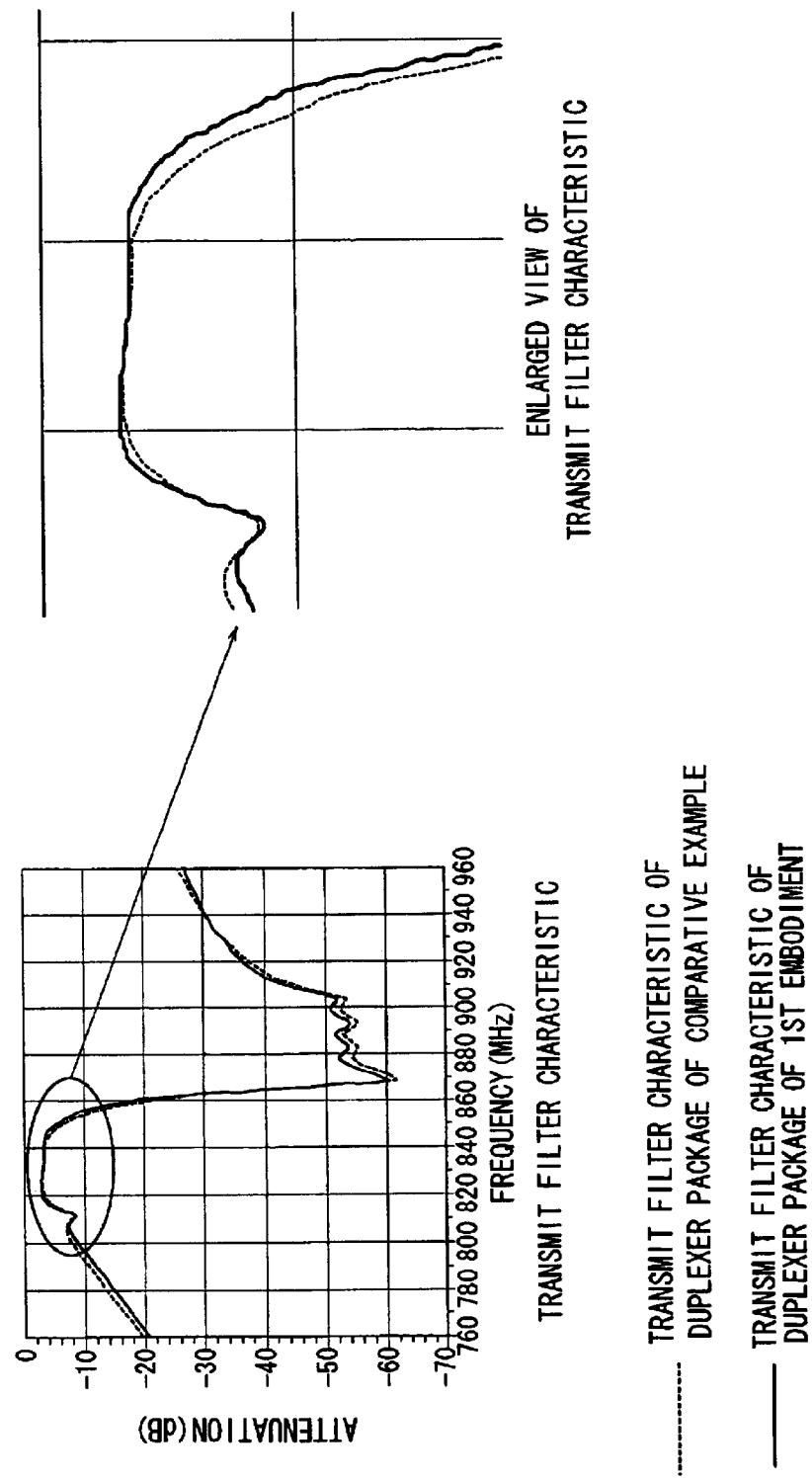
FIG. 8 is a graph of transmit filter characteristics of the first embodiment and the comparative example.
Figure 9:
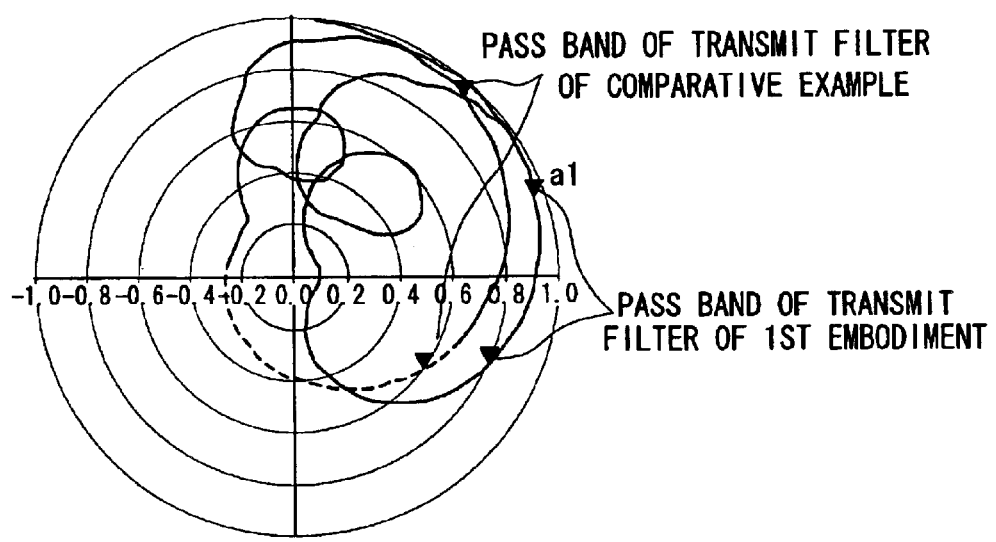
FIG. 9 is a graph of a reflection characteristic of a receive filter alone.

FIG. 8 shows characteristics of the transmit filters of the present embodiment and comparative example. FIG. 9 shows characteristics of the receive filters alone of the present embodiment and comparative example (to which the transmit filters are not connected). The horizontal axis of the graph of FIG. 8 denotes frequency (MHz), and the vertical axis thereof denotes attenuation (dB). The solid line in FIG. 8 is a characteristic of the first embodiment of the present invention, and the broken line is a characteristic of the comparative example. FIG. 9 is a polar chart. It can be seen from FIG. 9 that the first embodiment has a characteristic impedance higher than that of the comparative example and realizes a higher reflection factor value in the pass band of the transmit filter $26_1$. This makes it difficult for the transmit signal applied across the terminals T5 and T6 to enter into the receive filter $26_2$, resulting in improvement in the insertion loss of the transmit filter $26_1$. As a result, the amount of attenuation of the transmit filter $26_1$ in the pass band is smaller than that of the comparative example. Also, the bandwidth of the transmit filter $26_1$, of the first embodiment of the invention is improved, as compared to the comparative example. Further, the degree of suppression is improved according to the first embodiment. Improvement in insertion loss lengthens the lifetime of the cell in the portable communication device equipped with the duplexer. Improvement in the bandwidth contributes to enhancing the production yield.

The outer ground pattern 37 is commonly connected to the other ground patterns, and is not a floating conductor. Thus, the filters are immune to external interference so that the filter characteristics can be stabilized.

According to the first embodiment of the present invention, it is possible to prevent decrease in the characteristic impedance and improve the miniaturized filter characteristic of the duplexer.

Various variations of the first embodiment of the present invention may be made. For example, the multilayer package 20 is not limited to five layers, but may include an arbitrary number of layers. If a new layer is interposed between the layers 24 and 25 shown in FIG. 2A, the distance d1 will be lengthened and the matching line 30 may have further improved characteristic impedance. A layer that corresponds to the outer ground pattern 37 may be provided on the above-mentioned new layer in order to secure the sufficient distance d1. Although the opening 56 formed in the inner ground pattern 32 has the rectangular shape, it may have another shape. In FIG. 2A, although the matching line 50 have five sectional parts, it may have a larger or smaller number of sectional parts. A larger number of sectional parts is available by increasing the number of bent portions, and a smaller number of sectional parts is available by decreasing the number of bent portions. The matching line 30 is not limited to the arrangement shown in FIG. 2A in which the only end portions thereof are covered, but may be covered so that intermediate sectional parts of the matching line 30 are additionally covered. The matching line 30 is not limited to the pattern shown in FIG. 4B, but may be patterned arbitrarily. The filter chip 26 has the single substrate of a piezoelectric material. However, this is not essential from a viewpoint of arrangement of the ground pattern with respect to the matching line 30. Of course, it may be desired to form the filters $26_1$ and $26_2$ on the single substrate in terms of downsizing of the duplexer. The parts of the duplexers are not limited to the aforementioned materials but may be made of other appropriate substances. The duplexer is not limited to the use of two SAW filters but may employ three SAW filters or more.

Figure 10A:
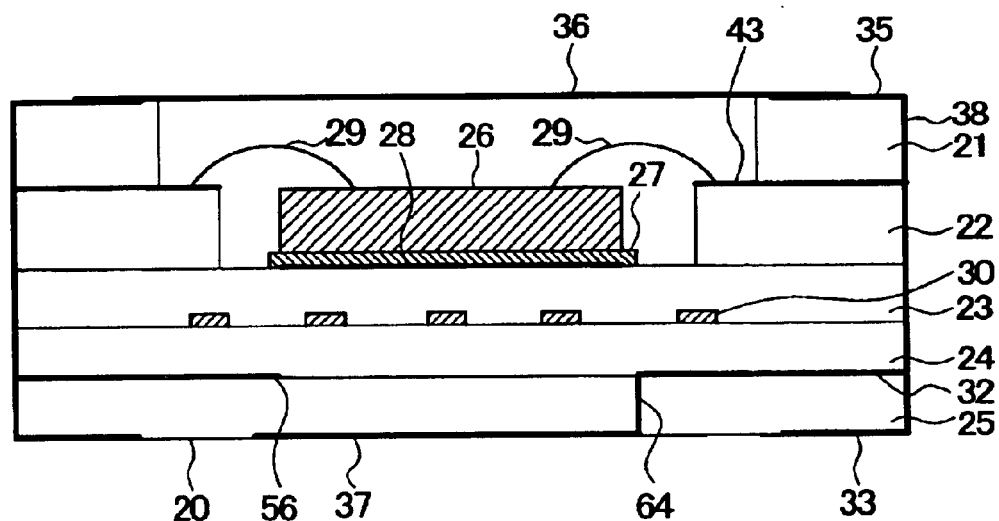
FIG. 10A is a cross-sectional view of a variation of the first embodiment of the invention.
Figure 10B:
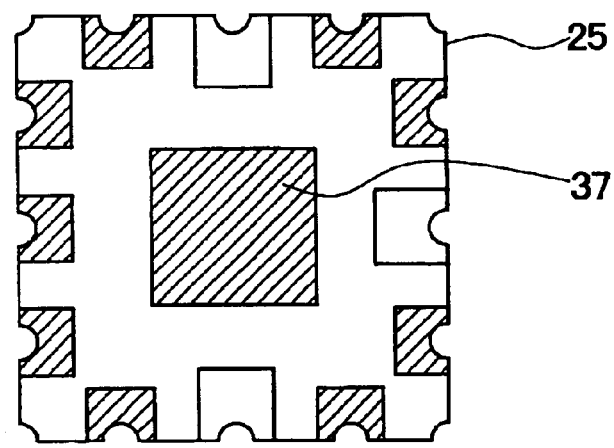
FIG. 10B is a bottom view of a common ground layer used in the above variation.

As shown in FIG. 10A, a via 64 may be provided in the common ground layer 25. The via 64 connects the inner ground pattern 32 and the outer ground pattern 37. In this case, the mount surface of the duplexer, that is, the bottom surface of the common ground layer 25 may be formed as shown in FIG. 10B. The outer ground pattern 37 shown in FIG. 10B has a rectangular or square shape and is isolated. Further, the outer ground pattern A does not have any part like the lead line 63 shown in FIG. 4D. It is also possible to employ both the ground pattern shown in FIG. 4D and the via 64 shown in FIG. 10A.

Second Embodiment

Figure 11A:
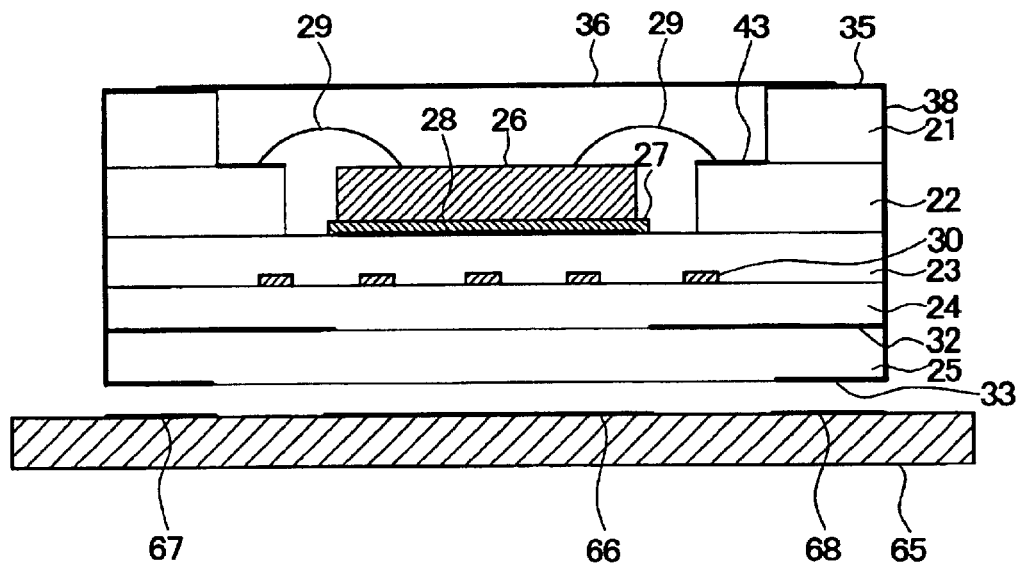
FIG. 11A is a cross-sectional view of a duplexer according to a second embodiment of the present invention.
Figure 11B:
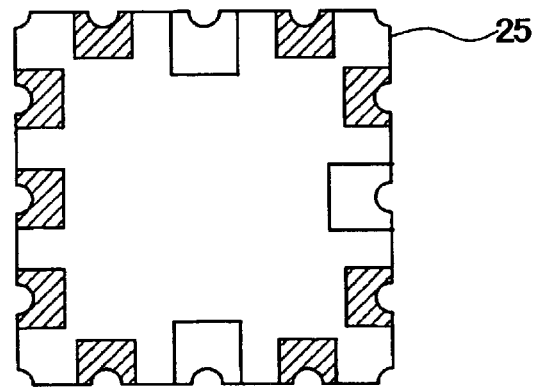
FIG. 11B is a bottom view of a common ground layer employed in the duplexer shown in FIG. 11A.

Now, a description will be given of a second embodiment of the present invention with reference to FIGS. 11A and 11B. FIG. 11A is a cross-sectional view of a duplexer according to the second embodiment of the present invention. This sectional view is taken along the line IIa—IIa shown in FIG. 4A on the second embodiment duplexer. In FIGS. 11A and 11B, parts that are the same as those shown in the previously described figures are given the same reference numerals.

The duplexer of the present embodiment does not have the outer ground pattern 37 that the first embodiment has. Thus, the bottom surface (lower or mount surface) of the common ground layer 25 is arranged as shown in FIG. 11B.

The surface of the common ground layer is exposed in the center portion thereof. Rather than the outer ground pattern 37, a ground pattern 66 is formed on a circuit or wiring board 65 such as a printed circuit board and is located in the center of the bottom surface of the common ground layer 25. Parts indicated by reference numerals 67 and 68 are terminals (pads) on the circuit board 65. The terminals on the circuit board 65 may contact the external connection terminals formed on the mount surface of the common ground layer 25 of the duplexer. After the duplexer is mounted on the circuit board 65, the lower ground plane with respect to the phase matching line 30 is provided by the ground pattern 66, so that functions and effects similar to those of the first embodiment can be obtained.

As described above, the duplexer according to the second embodiment of the present invention includes the multilayer package 20 that accommodates two SAW filters $26_1$ and $26_2$ having different band center frequencies and the phase matching line 30 that matches the phases of the SAW filters, the package 20 including the die attachment part 28 (first ground pattern) that underlies the SAW filters $26_1$ and $26_2$, the inner ground pattern 32 (second ground pattern) that has the opening 56 in the position corresponding to the first ground pattern and is provided in the multilayer package 20, and the cap provided on the multilayer package 20, wherein the ground layers with respect to the matching line 30 is formed by the combination of the second ground pattern 32 and the cap 36, and the combination of the first ground pattern 28 and the conductive pattern 66 on the board 65 on which the duplexer is mounted.

The circuit board 65 on which the above duplexer is defined as an electronic device such as a circuit board or card.

Third Embodiment

Figure 12:
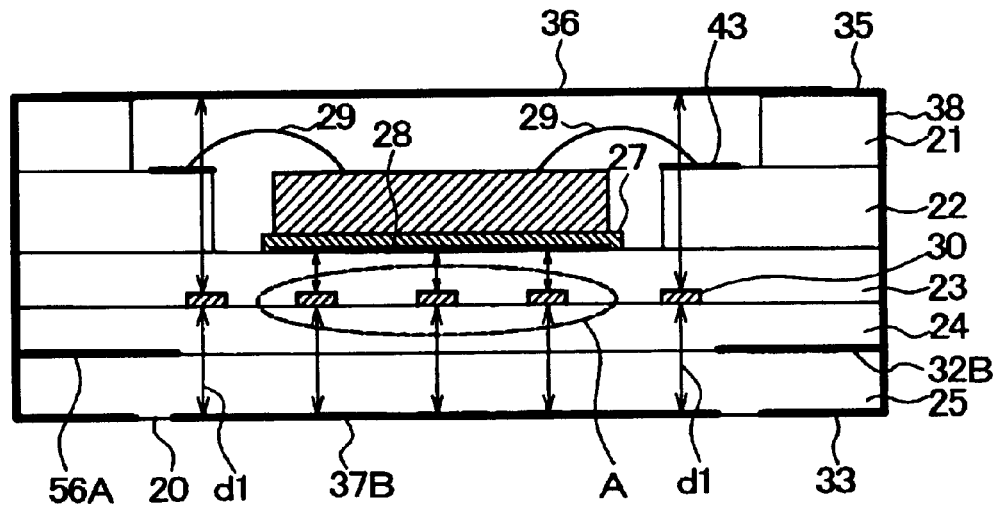
FIG. 12 is a cross-sectional view of a duplexer according to a third embodiment of the present invention.

FIG. 12 is a cross-sectional view of a duplexer according to a third embodiment of the present invention, in which parts that are the same as those shown in the previously described figures are given the same reference numerals.

As shown in FIG. 12, an outer ground patter 37B is wider than the outer ground pattern 37 shown in FIG. 2A. The outer ground pattern 37 has a size that substantially covers the whole matching line 30. Thus, the phase matching line 30 is interposed between the cap 36 and the outer ground pattern 37B. In other words, only a pair of ground patterns covers the matching line 30. Even the outermost sectional parts of the matching line 30 are covered by the outer ground pattern 37B rather than an inner ground pattern 32B as indicated by d1. It is therefore possible to more effectively suppress decrease of the characteristic impedance. Since the inner ground pattern 32B does not serve as ground with respect to the matching line 30, it may be smaller than the inner ground pattern 32 shown in FIG. 2A. In other words, an opening 56A formed in the inner ground pattern 32B is greater than the opening 56 shown in FIG. 2A, and the whole matching line 30 can be seen via the opening 56A. The inner ground pattern 32 may be omitted.

The outer ground pattern 37B is electrically connected to the conductive path $38_4$, as shown in FIG. 4D and is common to the other ground patterns.

Figure 13:
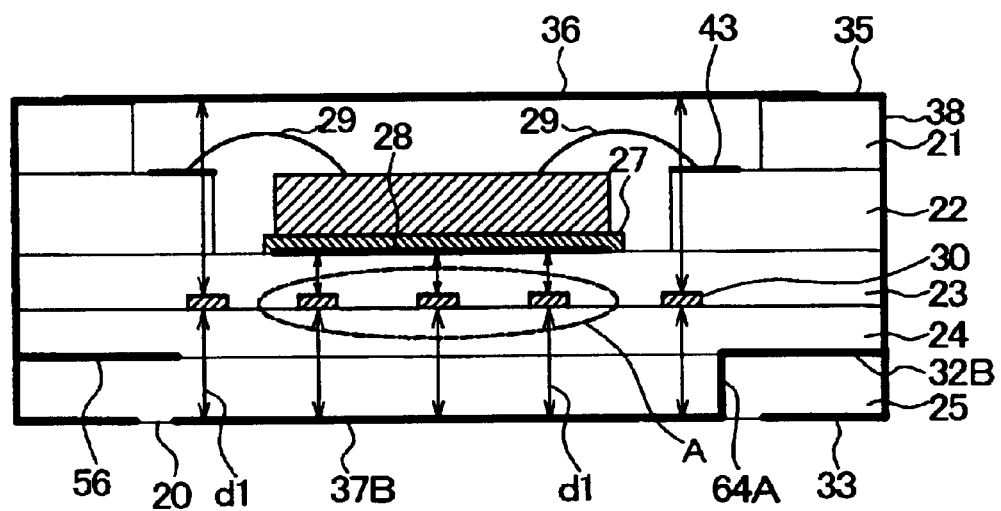
FIG. 13 is a cross-sectional view of a variation of the duplexer shown in FIG. 12.

As shown in FIG. 13, the outer ground pattern 37B and the inner ground pattern 32B may be electrically connected by means of a via 64A. In this case, the outer ground pattern 37B may be an isolated pattern like the arrangement shown in FIG. 10B.

A ground pattern corresponding to the outer ground pattern 37B may be formed on the circuit board in such a way as shown in FIG. 11, so that the outer ground pattern 37B can be omitted.

Fourth Embodiment

Figure 14:
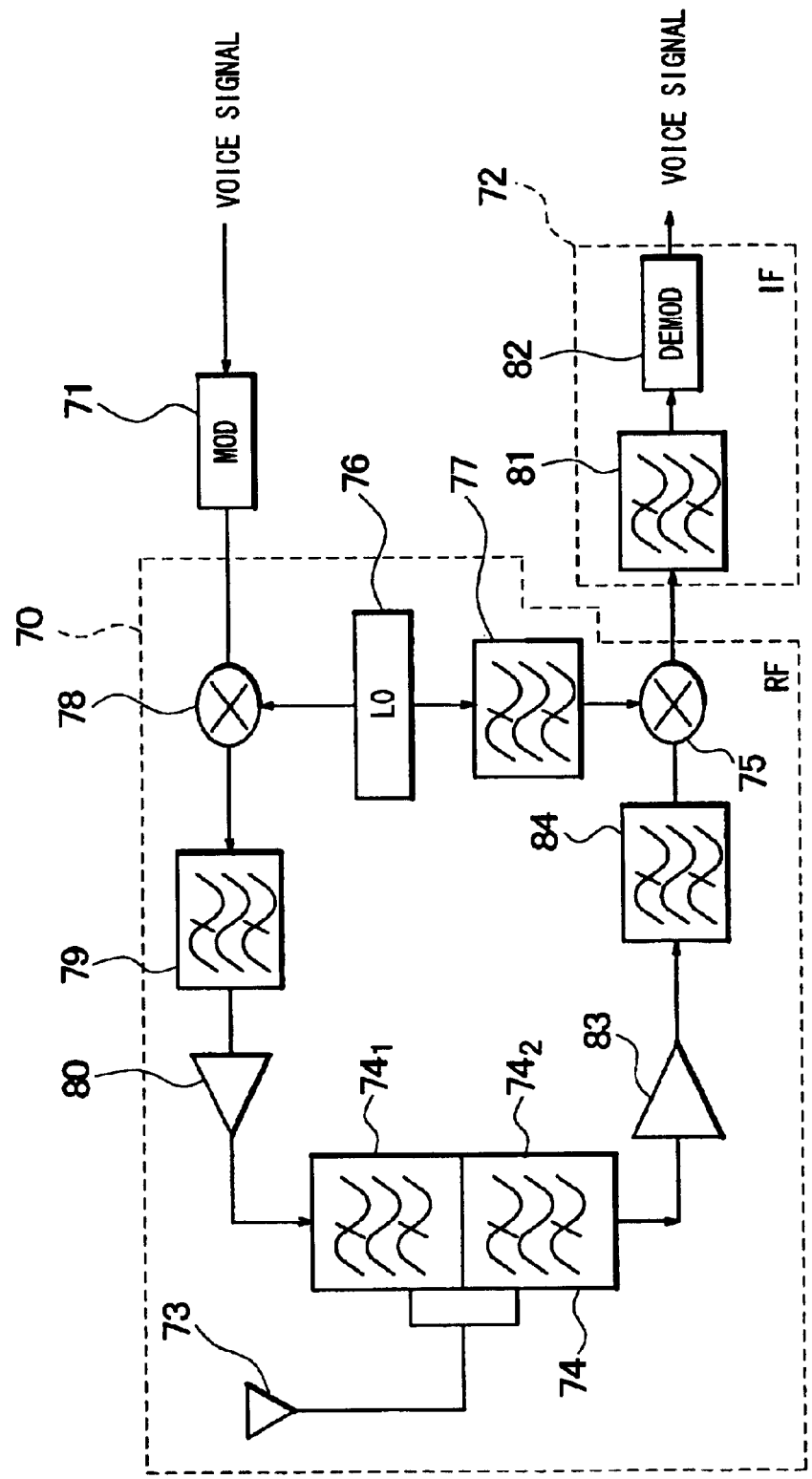
FIG. 14 is a block diagram of a communication device according to a fourth embodiment of the present invention.

FIG. 14 is a block diagram of an electronic device according to a fourth embodiment of the present invention. The electronic device is a cellular phone, and FIG. 14 shows a transmit/receive system thereof. A voice processing system and other parts are omitted for convenience' sake. The cellular phone employs the duplexer of the present invention.

The cellular phone includes an RF (radio frequency) part 70, a modulator 71, and an IF (Intermediate Frequency) part 72. The RF part 70 includes an antenna 73, a duplexer 74, a low-noise amplifier 83, an inter-stage filter 84, a mixer (multiplier) 75, a local oscillator 76, an inter-stage filter 77, a mixer (multiplier) 78, an inter-stage filter 79 and a power amplifier 80. A voice signal from the voice processing system is modulated by the modulator 71 and is mixed (frequency-converted) with an oscillation signal from the local oscillator 76 by the mixer 78 of the RF part 70. The output signal of the mixer 78 passes through the inter-stage filter 79 and the power amplifier 80, and is then applied to the duplexer 74. The duplexer 74 includes a transmit filter $74_1$, a receive filter $74_2$, and a phase (impedance) matching circuit that is not shown for the sake of simplicity), and is configured as described before. A transmit signal from the power amplifier 80 passes through the duplexer 74 and is then supplied to the antenna 73.

A receive signal from the antenna 73 passes the receive filter $74_2$ of the duplexer 74, and is then applied to the mixer 75 via the low-noise amplifier 83 and the inter-stage filter 84. The mixer 75 receives the oscillation signal from the local oscillator 76 via the inter-stage filter 77, and mixes it with the receive signal. The resultant frequency-converted signal is received by the demodulator 82 via the IF filter 81 of the IF part 72. The received signal is demodulated into the original voice signal.

The cellular phone shown in FIG. 14 is equipped with the duplexer of the present invention, and is therefore a high performance, low power consumption and low production cost communication device.

According to the present invention, it is possible to provide the compact duplexer of the excellent filter characteristics and the electronic device equipped with the same.

The present invention is not limited to the specifically disclosed embodiments and variations, and other embodiments and variations may be made without departing from the scope of the present invention.

This application is based on, and claims priority to, Japanese application number 2001-359567, filed on Nov. 26, 2001, in Japan, and which is incorporated herein by reference.

What is claimed is:

1. A duplexer comprising:
   a multilayer package;
   SAW (Surface Acoustic Wave) filters that have different band center frequencies and are provided in the multilayer package; and
   a phase matching line that matches phases of the SAW filters and are provided in the multilayer package,
   a first ground pattern with respect to the phase matching line being provided on a mount surface of the multilayer package,
   a first distance between the phase matching line and the first ground pattern at a position just below the SAW filters being greater than a second distance between the phase matching line and an inner ground pattern provided in the multilayer package at a position that is further out than the SAW filters in a lateral direction of the duplexer.

2. The duplexer according to claim 1, wherein the first ground pattern is formed so as to face at least part of the phase matching line.

3. The duplexer according to claim 1, further comprising a second ground pattern provided on a chip mount surface of the multilayer package, the phase matching line being interposed between the first and second ground pattern.

4. The duplexer according to claim 1, wherein:
a multilayer package has a cap attachment surface; and
the phase matching line is interposed between the first ground pattern and the cap attached to the cap attachment surface.

5. The duplexer according to claim 1, wherein the SAW filters are formed on a single filter chip.

6. A duplexer comprising:
a multilayer package;
SAW (Surface Acoustic Wave) filters that have different band center frequencies and are provided in the multilayer package; and
a phase matching line that matches phases of the SAW filters and are provided in the multilayer package,
a plurality of ground patterns with respect to the phase matching line being provided at a first side of the multilayer package opposite to a second side thereof at which the SAW filters are provided.

7. The duplexer according to claim 6, wherein one of the plurality of ground patterns is provided in the multilayer package.

8. The duplexer according to claim 6, wherein the plurality of ground patterns are connected to form common ground.

9. The duplexer according to claim 6, wherein one of the plurality of ground patterns is provided on a mount surface of the multilayer package.

10. The duplexer according to claim 6, wherein the plurality of ground patterns are electrically connected via connecting parts provided in the multilayer package.

11. An electronic device comprising a duplexer and a circuit board,
the duplexer comprising:
a multilayer package;
SAW (Surface Acoustic Wave) filters that have different band center frequencies and are provided in the multilayer package; and
a phase matching line that matches phases of the SAW filters and are provided in the multilayer package,
a first ground pattern with respect to the phase matching line being provided on a mount surface of the multilayer package,
a first distance between the phase matching line and the first ground pattern at a position just below the SAW filters being greater than a second distance between the phase matching line and an inner ground pattern provided in the multilayer package at a position that is further out than the SAW filters in a lateral direction of the duplexer.

12. A duplexer comprising:
a multilayer package;
SAW (Surface Acoustic Wave) filters that have different band center frequencies and are provided in the multilayer package; and
a phase matching line that matches phases of the SAW filters and are provided in the multilayer package;
a first ground pattern that underlies the SAW filters;
a second ground pattern that has an opening formed so as to face the first ground pattern and is provided in the multilayer package;
a third ground pattern that is provided on a mount surface of the multilayer package and faces the opening of the second ground pattern; and
a cap provided on the multilayer package,
ground with respect to the phase matching line being provided by a combination of the first and third ground patterns and another combination of the second ground pattern and the cap.

13. The duplexer according to claim 12, wherein the opening and the first ground pattern have a substantially identical shape.

14. The duplexer according to claim 12, wherein the opening and the third ground pattern have a substantially identical shape.

15. The duplexer according to claim 12, wherein the first, second and third ground patterns are commonly connected.

16. A duplexer comprising:
a multilayer package;
SAW (Surface Acoustic Wave) filters that have different band center frequencies and are provided in the multilayer package;
a phase matching line that matches phases of the SAW filters and are provided in the multilayer package;
a first ground pattern that underlies the SAW filters;
a second ground pattern that has an opening formed so as to face the first ground pattern and is provided in the multilayer package; and
a cap provided on the multilayer package,
ground with respect to the phase matching line being provided by a combination of the second ground pattern and the cap and another combination of the first ground pattern and a conductive pattern on a board on which the duplexer is mounted.

17. A duplexer comprising:
a multilayer package;
SAW (Surface Acoustic Wave) filters that have different band center frequencies and are provided in the multilayer package; and
a phase matching line that matches phases of the SAW filters and are provided in the multilayer package;
ground with respect to the phase matching line being provided by a ground pattern provided on a mount surface of the multilayer package and a cap provided on the multilayer package,
a first distance between the phase matching line and the first ground pattern at a position just below the SAW filters being greater than a second distance between the phase matching line and an inner ground pattern provided in the multilayer package at a position that is further out than the SAW filters in a lateral direction of the duplexer.

18. The duplexer according to claim 17, wherein the ground with respect to the phase matching line is further provided by the ground pattern and a conductive layer that underlies the SAW filters.

19. A duplexer comprising:
a multilayer package;
SAW (Surface Acoustic Wave) filters that have different band center frequencies and are provided in the multilayer package; and
a phase matching line that matches phases of the SAW filters and are provided in the multilayer package;

a ground layer with respect to the phase matching line being provided so that at least two of layers forming the multilayer package are interposed between the phase matching line and the ground layer, the ground layer being provided on a bottom of the multilayer package.

20. The duplexer according to claim 19, wherein the ground layer includes a ground pattern provided on a mount surface of the multilayer package and a cap attached to the multilayer package.

21. A duplexer comprising:

a multilayer package;

SAW (Surface Acoustic Wave) filters that have different band center frequencies and are provided in the multilayer package; and a phase matching line that matches phases of the SAW filters and are provided in the multilayer package;

ground with respect to the phase matching line being provided by a first combination of ground patterns and a second combination of ground patterns so that the phase matching line is interposed between the first combination of ground patterns and the second combination of ground patterns, the ground patterns of the first combination being different from those of the second combination.

22. A duplexer comprising:

a multilayer package;

SAW (Surface Acoustic Wave) filters that have different band center frequencies and are provided in the multilayer package; and a phase matching line that matches phases of the SAW filters and are provided in the multilayer package, a plurality of ground patterns with respect to the phase matching line being provided at a first side of the multilayer package opposite to a second side thereof at which the SAW filters are provided, wherein:

the plurality of ground patterns include a first conductive layer provided on a mount surface of the multilayer package, and a second conductive layer provided in the multilayer package; and the second conductive layer has an opening through which the first conductive layer faces the phase matching line.

23. The duplexer according to claim 22, wherein the opening and the first conductive layer have substantially identical shape.

24. A electronic device comprising an antenna, a duplexer connected thereto, and a transmit/receive circuit connected to the duplexer, the duplexer comprising:

a multilayer package;

SAW (Surface Acoustic Wave) filters that have different band center frequencies and are provided in the multilayer package; and a phase matching line that matches phases of the SAW filters and are provided in the multilayer package, a first ground pattern with respect to the phase matching line being provided on a mount surface of the multilayer package, a first distance between the phase matching line and the first ground pattern at a position just below the SAW filters being greater than a second distance between the phase matching line and an inner ground pattern provided in the multilayer package at a position that is further out than the SAW filters in a lateral direction of the duplexer.

* * * * *

UNITED STATES PATENT AND TRADEMARK OFFICE
CERTIFICATE OF CORRECTION

PATENT NO. : 6,919,778 B2
APPLICATION NO. : 10/295910
DATED : July 19, 2005
INVENTOR(S) : Iwamoto et al.

Page 1 of 1

It is certified that error appears in the above-identified patent and that said Letters Patent is hereby corrected as shown below:

Title Page -

Item [73], Assignee Information

Please add the following Assignee's name and address:

-- Fujitsu Limited, Kanagawa (JP) --.

Signed and Sealed this

Thirteenth Day of February, 2007

JON W. DUDAS
*Director of the United States Patent and Trademark Office*

UNITED STATES PATENT AND TRADEMARK OFFICE
CERTIFICATE OF CORRECTION

PATENT NO.         : 6,919,778 B2  
APPLICATION NO. : 10/295910  
DATED                 : July 19, 2005  
INVENTOR(S)       : Iwamoto et al.

Page 1 of 1

It is certified that error appears in the above-identified patent and that said Letters Patent is hereby corrected as shown below:

Title Page -

Item [73], Assignee Information

Please add the following Assignee's name and address:

-- Fujitsu Limited, Kawasaki (JP) --.

This certificate supersedes the Certificate of Correction issued February 13, 2007.

Signed and Sealed this

Tenth Day of March, 2009

JOHN DOLL  
*Acting Director of the United States Patent and Trademark Office*